(12) United States Patent
Wang et al.

(10) Patent No.: US 12,191,341 B2
(45) Date of Patent: Jan. 7, 2025

(54) LIGHT EMITTING PANEL

(71) Applicant: AU OPTRONICS CORPORATION, Hsin-Chu (TW)

(72) Inventors: Shiw Chieh Wang, Hsin-Chu (TW); Kuan-Hsien Wu, Hsin-Chu (TW); Kuo-Yu Huang, Hsin-Chu (TW); You-Yuan Hu, Hsin-Chu (TW); Shih-Pin Cheng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 457 days.

(21) Appl. No.: 17/842,186

(22) Filed: Jun. 16, 2022

(65) Prior Publication Data
US 2023/0019253 A1    Jan. 19, 2023

(30) Foreign Application Priority Data
Jul. 13, 2021   (TW) .................. 110125686

(51) Int. Cl.
*H01L 33/10*    (2010.01)
*H01L 27/15*    (2006.01)

(52) U.S. Cl.
CPC ........... *H01L 27/156* (2013.01); *H01L 33/10* (2013.01)

(58) Field of Classification Search
CPC ................ H01L 27/156; H01L 33/10
USPC ........................................... 257/88
See application file for complete search history.

(56) References Cited

U.S. PATENT DOCUMENTS

| | | | |
|---|---|---|---|
| 7,651,254 B2 | 1/2010 | Yeh | |
| 9,074,754 B2 | 7/2015 | Liao | |
| 2015/0129900 A1* | 5/2015 | Yang | H01L 33/46 |
| | | | 257/98 |

FOREIGN PATENT DOCUMENTS

| | | | | |
|---|---|---|---|---|
| CN | 105065942 B | | 9/2017 | |
| KR | 20200002619 A | * | 1/2020 | ............ H01L 33/56 |
| TW | M289235 U | | 4/2006 | |
| TW | I363438 B | | 5/2012 | |
| TW | M565324 U | | 8/2018 | |

* cited by examiner

*Primary Examiner* — Phuc T Dang
(74) *Attorney, Agent, or Firm* — WPAT, PC

(57) ABSTRACT

The present invention provides a light emitting panel, which includes: a substrate, at least one light emitting element disposed on the substrate, and a reflective structure layer. The reflective structure layer includes a plurality of first microstructure units disposed on the substrate and distributed around the at least one light emitting element, and a plurality of second microstructure units disposed on and overlapping the first microstructure units. A spacing between adjacent first microstructure units among the first microstructure units is less than a spacing between adjacent second microstructure units among the second microstructure units.

21 Claims, 10 Drawing Sheets

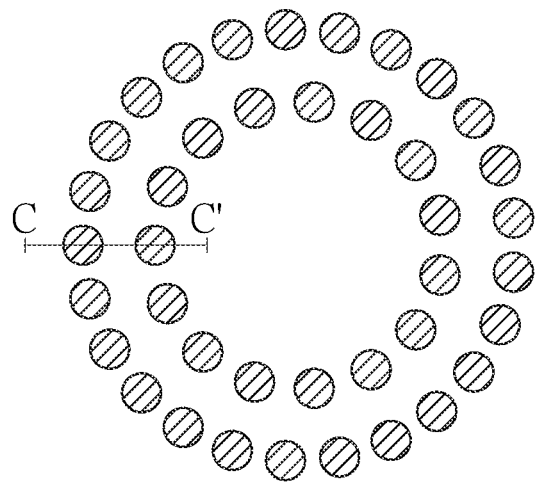
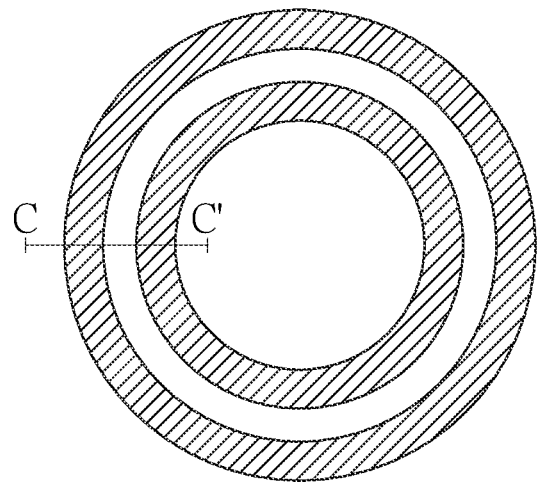
FIG. 13A          FIG. 13B
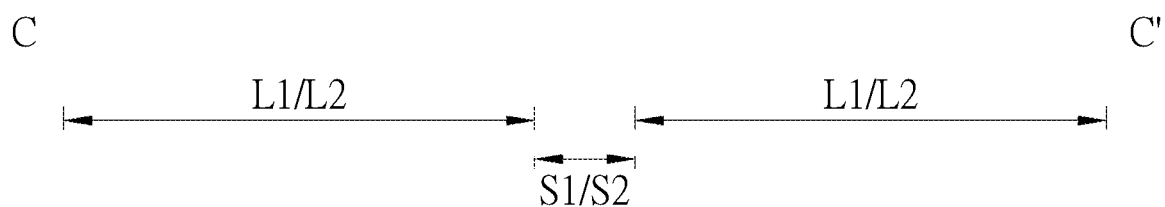
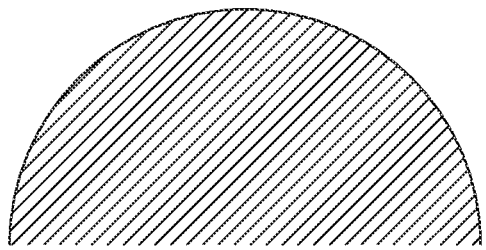
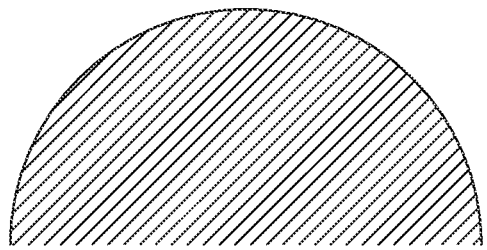
FIG. 13C

G21

LIGHT EMITTING PANEL

CROSS-REFERENCE TO RELATED APPLICATION

This application claims the priority benefit of Taiwan application serial no. 110125686, filed on Jul. 13, 2021. The entirety of the mentioned above patent application is hereby incorporated by reference herein and made a part of this specification.

TECHNICAL FIELD

The present invention relates to a light emitting panel. Specifically, the present invention relates to a light emitting panel having a plurality of first microstructure units and a plurality of second microstructure units.

BACKGROUND

The light emitting panel may be, for example but not limited to, disposed in a display device as a backlight source. Generally speaking, the light emitting panel may be configured with a light emitting source of a mini LED, an LED, an OLED, or the like, and diffuses or guides, based on the design of a material and a structure of the light emitting panel, light emitted by a light source to an expected direction for emission. However, the light emitted by the light source may be emitted from an unexpected angle or direction, and may not be uniformly diffused in the light emitting panel or may be trapped in the light emitting panel due to an optical phenomenon such as total reflection, resulting in reduced light exit efficiency. Therefore, it is necessary to develop a light emitting panel that can diffuse light more evenly and reduce or avoid light loss.

SUMMARY

Technical Means for Resolving the Problem

In order to resolve the above problems, an embodiment of the present invention provides a light emitting panel, including: a substrate; at least one light emitting element, disposed on the substrate; and a reflective structure layer. The reflective structure layer includes: a plurality of first microstructure units disposed on the substrate and distributed around the at least one light emitting element, and a plurality of second microstructure units disposed on and overlapping the first microstructure units. A spacing between adjacent first microstructure units among the first microstructure units is less than a spacing between adjacent second microstructure units among the second microstructure units.

Benefits Compared to the Prior Art

According to the light emitting panel provided in the embodiments of the present invention, the light emitted from the light emitting element may be guided and emitted out by means of the first microstructure units and the second microstructure units. For example, a larger range of rays of light may be reflected and guided by the first microstructure units spaced apart by a smaller spacing, and a smaller range of rays of light may be reflected and guided by the second microstructure units, or the rays of light reflected and guided by the first microstructure units are further reflected and guided, so as to emit light from an expected angle or direction. Therefore, the diffusion uniformity of the emitted light can be improved, and the light exit efficiency can be enhanced.

BRIEF DESCRIPTION OF THE DRAWINGS

FIG. 13A and FIG. 13B are each a schematic diagram of a configuration of microstructure units in an annular form according to a thirteenth embodiment and a fourteenth embodiment of the present invention.

FIG. 13C is a schematic cross-sectional view of adjacent microstructure units according to a fifteenth embodiment of the present invention.

DETAILED DESCRIPTION

Embodiments are described below, and a person of ordinary skill in the art should easily understand the spirit and the principle of the present invention with reference to the accompanying drawings. However, even though some specific embodiments may be described in detail in this specification, the embodiments are merely examples, and shall not be regarded as limitations or exhaustive meanings in terms of every aspect. Therefore, for a person of ordinary skill in the art, variations and amendments of the present invention may be obvious and may be achieved easily without departing from the spirit and the principle of the present invention.

Figure 1:
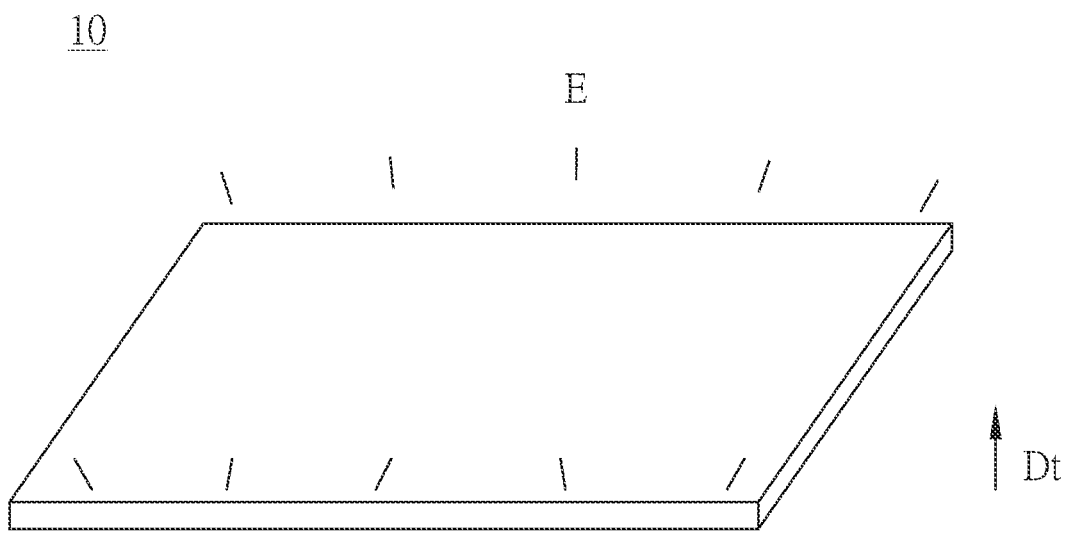
FIG. 1 is a three-dimensional schematic diagram of a light emitting panel according to a first embodiment of the present invention.

Referring to FIG. 1, a light emitting panel 10 according to an embodiment of the present invention may be configured to emit light E. For example, the light E may be emitted upward substantially along a height direction Dt of the light emitting panel 10. Carrying on with the above, further referring to FIG. 2, when viewed from an opposite direction of the height direction Dt shown in FIG. 1, the light emitting panel 10 according to this embodiment may actually have at least one light emitting element 200. For example, a light emitting source such as a mini LED, a micro LED, an OLED, an LED, or the like is arranged in the light emitting panel 10. The light emitting panel 10 may have a light exit source by means of the at least one light emitting element 200, and further diffuse and guide the light by means of the design of a material, a shape, or a structure of other components or parts of the light emitting panel 10.

Figure 2:
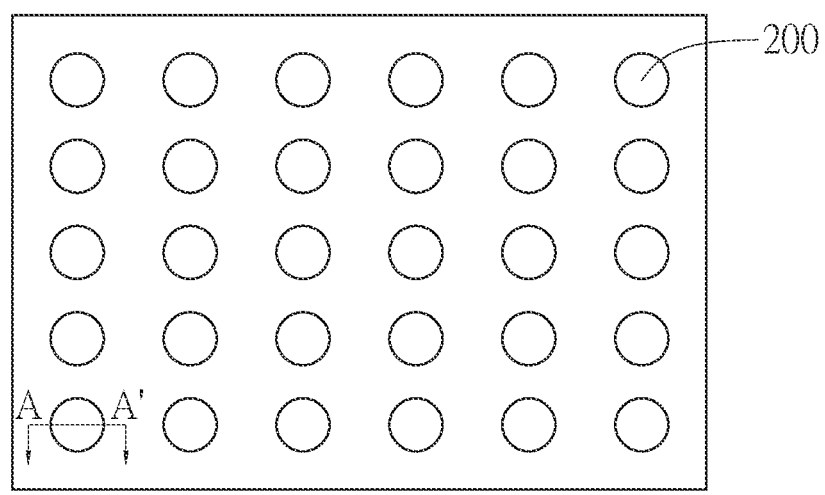
FIG. 2 is a schematic top view of a light emitting panel according to a second embodiment of the present invention.
Figure 3:
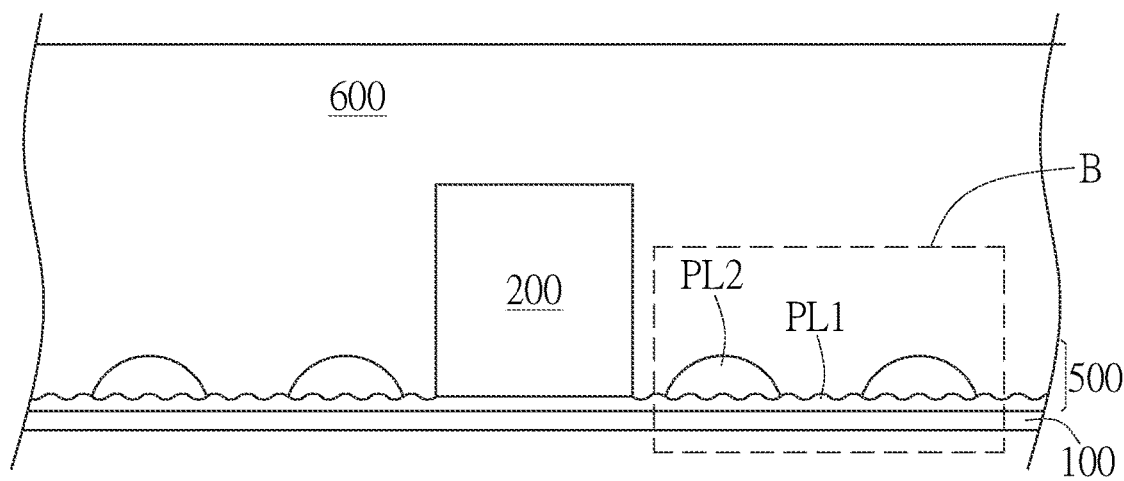
FIG. 3 is a schematic cross-sectional view of a light emitting panel according to a third embodiment of the present invention.

Carrying on with the above, referring to FIG. 3, a section along a section line A-A' of FIG. 2 in the height direction Dt of the light emitting panel 10 is illustrated exemplarily. The light emitting panel 10 according to this embodiment includes: a substrate 100; at least one light emitting element 200 disposed on the substrate 100; and a reflective structure layer 500 disposed on the substrate 100. For example, a glass substrate may be used as the substrate 100, and the light emitting elements 200 are disposed on the substrate 100 at every interval of 4000 μm, but the present invention is not limited thereto. In addition, in some embodiments, a light guide medium layer 600 may also be added on the substrate 100 to cover or encase the at least one light emitting element 200 and the reflective structure layer 500 on the above structure. For example, a light-transmitting flip-chip adhesive or die-bonding adhesive may be disposed on the substrate 100 to cover the light emitting element 200 and the reflective structure layer 500.

In addition, if the at least one light emitting element 200 is required to be connected to a circuit, according to other embodiments of the present invention, a circuit substrate or a printed circuit may be further disposed, but the light emitting panel of the present invention is not limited thereto. Carrying on with the above, the at least one light emitting element 200 may also be a component that is not required to be connected to a circuit and can emit light by itself or in other forms, and therefore there is no need to dispose a corresponding circuit substrate, a printed circuit, or the like.

Next, according to this embodiment, the reflective structure layer 500 may substantially include a plurality of first microstructure units PL1 and a plurality of second microstructure units PL2. For example, according to some embodiments, the first microstructure units PL1 and the second microstructure units PL2 may be formed in the shape of bumps having curved surfaces. For example, the first microstructure units PL1 may be connected to each other to form a wave shape, and the second microstructure units PL2 may be formed to be island-like, but the present invention is not limited thereto.

Carrying on with the above, the plurality of first microstructure units PL1 are disposed on the substrate 100 and distributed around the at least one light emitting element 200, and the plurality of second microstructure units PL2 are disposed on and overlap the first microstructure units PL1. For example, the plurality of second microstructure units PL2 may be formed on the first microstructure units PL1 to at least partially cover the first microstructure units PL1.

In FIG. 3, in order to clearly show the plurality of first microstructure units PL1 and the plurality of second microstructure units PL2 of the reflective structure layer 500, proportions of the plurality of first microstructure units PL1 and the plurality of second microstructure units PL2 relative to the light emitting element 200 may be magnified or distorted. In addition, quantities of the plurality of first microstructure units PL1 and the plurality of second microstructure units PL2 actually distributed around the one light emitting element 200 may also be different from exemplary quantities shown in FIG. 3 (for example, an actual quantity is more), and the quantity shown herein is for reference only. Carrying on with the above, in addition to the first microstructure units PL1 and the second microstructure units PL2, proportions, relative proportions, and quantities of various components actually shown in the figures of the disclosure are only for illustrative reference, and may differ from actual proportions, relative proportions, and quantities for clarity of presentation.

Figure 4:
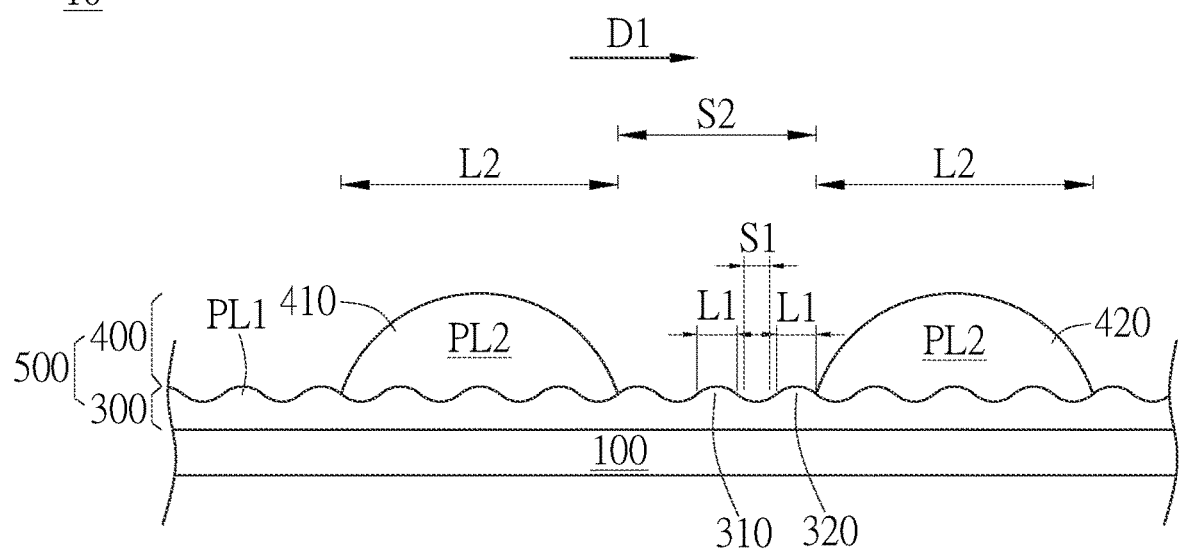
FIG. 4 is an enlarged schematic cross-sectional view of a light emitting panel according to a fourth embodiment of the present invention.

Carrying on with the above, according to this embodiment, referring to FIG. 4 showing an enlarged schematic view of a partial area B of FIG. 3 together with FIG. 3, a spacing between adjacent first microstructure units among the first microstructure units PL1 may be less than a spacing between adjacent second microstructure units among the second microstructure units PL2. For example, a spacing S1 between adjacent first microstructure units 310 and 320 among the first microstructure units PL1 may be less than a spacing S2 between adjacent second microstructure units 410 and 420 among the second microstructure units PL2. For example, a distribution density of the first microstructure units PL1 may be higher than a distribution density of the second microstructure units PL2. Alternatively, each of the second microstructure units PL2 may at least partially overlap and cover more than one of the first microstructure units PL1 (for example, the second microstructure unit may overlap the entire body or part of the body of the plurality of first microstructure units PL1). Carrying on with the above, a part of the first microstructure units PL1 among the first microstructure units PL1 may alternatively be disposed without overlapping the second microstructure units PL2. For example, a part of the first microstructure units PL1 among the first microstructure units PL1 may not be overlapped and covered by the second microstructure units PL2.

According to some embodiments, if a manufacturing process allows, the first microstructure units PL1 may be arranged adjacent to each other as densely as possible, so as to enhance the efficiency of diffusing light.

Carrying on with the above, according to some embodiments, along a direction such as a first direction D1, each of the first microstructure units PL1 may have a cross-sectional bottom length L1, and each of the second microstructure units PL2 may have a cross-sectional bottom length L2. Carrying on with the above, the spacing S1 may exist between the cross-sectional bottom lengths L1 of adjacent first microstructure units PL1, the spacing S2 may exist between the cross-sectional bottom lengths L2 of adjacent second microstructure units PL2, and the spacing S1 may be less than the spacing S2. However, according to some embodiments, the spacing S1 between adjacent first microstructure units PL1 may even be small enough to be negligible or indistinguishable. For example, as shown in FIG. 4, the reflective structure layer 500 may actually have a first structure layer 300 formed by the first microstructure units PL1 and a second structure layer 400 formed by the second microstructure units PL2. The obvious spacing S2 may be formed between the second microstructure units PL2 in the second structure layer 400. However, the first microstructure units PL1 in the first structure layer 300 may be closely adjacent or connected to each other, and have a relatively small spacing S1 or even no spacing S1 or the spacing S1 that is difficult to define and distinguish. As indicated above, the spacing S1 shown herein is marked for reference only for illustration.

Figure 5:
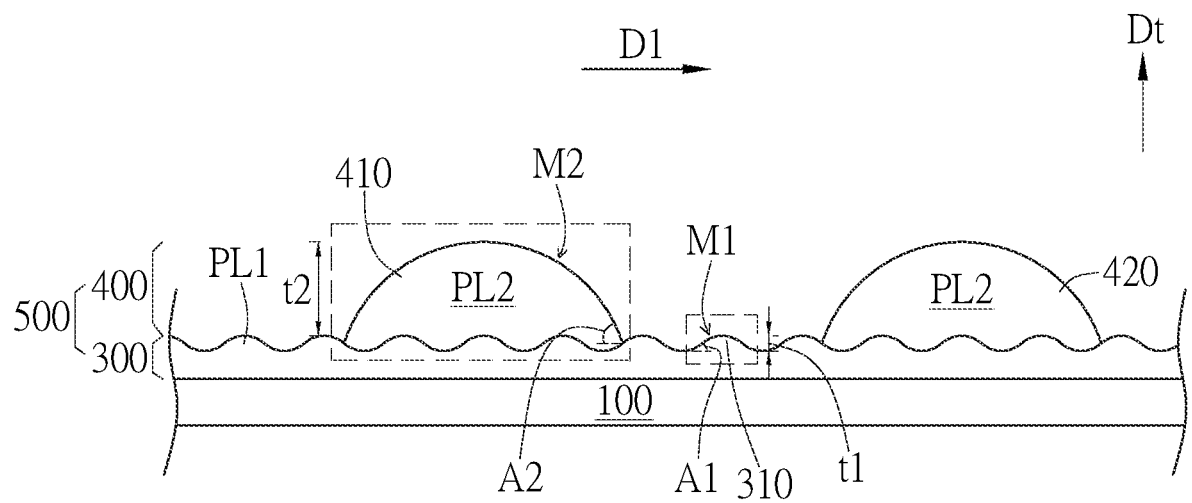
FIG. 5 is an enlarged schematic cross-sectional view of a light emitting panel according to a fifth embodiment of the present invention.

Further, according to some embodiments, each of the second microstructure units PL2 may be larger than each of the first microstructure units PL1. For example, as shown in FIG. 4, the cross-sectional bottom length L1 of the first microstructure unit PL1 may be less than the cross-sectional bottom length L2 of the second microstructure unit PL2. Alternatively, as shown in FIG. 5, a height t1 of the first microstructure unit PL1 such as a first microstructure unit 310 may be less than a height t2 of the second microstructure unit PL2 such as a second microstructure unit 410.

According to some embodiments, the height t1 of the first microstructure units PL1 may range from 1 μm to 5 μm. The heights of the second microstructure units PL2 are higher than those of the first microstructure units PL1. In addition, the cross-sectional bottom length L1 of the first microstructure units PL1 may range from 2.5 μm to 15 μm, and the spacing S1 between adjacent ones of the first microstructure units PL1 may range from 2.5 μm to 15 μm. The cross-sectional bottom length L2 of the second microstructure units PL2 may range from 5 μm to 20 μm, and the spacing S2 between adjacent ones of the second microstructure units PL2 may range from 5 μm to 20 μm. However, the above is merely an example, and the present invention is not limited thereto.

In some embodiments, a proportion of the cross-sectional bottom length L2 of the second microstructure units PL2 to the spacing S2 may be 1, but the present invention is not limited thereto. For example, according to other embodiments, the spacing S2 among the second microstructure units PL2 may also be greater or less than the cross-sectional bottom length L2 of the second microstructure units PL2.

Carrying on with the above, a pitch between the first microstructure units PL1 may be the cross-sectional bottom length L1 plus the spacing S1, and a pitch between the second microstructure units PL2 may be the cross-sectional bottom length L2 plus the spacing S2.

Further, the first microstructure units PL1 of the light emitting panel 10 may have, for example, a cross-sectional area M1 in a cross section along the height direction Dt, and the second microstructure units PL2 of the light emitting panel 10 may have, for example, a cross-sectional area M2 in a cross section along the height direction Dt. Carrying on with the above, a minimum cross-sectional area M1 of each of the first microstructure units PL1 in the height direction Dt (for example, along the first direction D1) may be less than a minimum cross-sectional area M2 of each of the second microstructure units PL2 in the height direction Dt (for example, along the first direction D1). However, the present invention is not limited thereto. Provided that the spacing S1 between the adjacent first microstructure units PL1 among the first microstructure units PL1 is less than the spacing S2 between the adjacent second microstructure units PL2 among the second microstructure units PL2, other variations are possible according to other embodiments. For example, each of the second microstructure units PL2 may also have similar or approximate sizes as each of the first microstructure units PL1, and may have different distribution quantities or specific detail shapes to achieve different spacings.

In addition, according to this embodiment, as shown in FIG. 5, a base angle A1 of each of the first microstructure units PL1 (for example, the first microstructure unit 310) may be less than a base angle A2 of each of the second microstructure units PL2 (for example, the second microstructure unit 410). For example, the base angle A1 of each of the first microstructure units PL1 may be between 0 degrees and 15 degrees, and the base angle A2 of each of the second microstructure units PL2 may be between 20 degrees and 50 degrees. For example, the base angle A1 of the first microstructure unit 310 may be 10 degrees, and the base angle A2 of the second microstructure unit 410 may range from 30 degrees to 40 degrees. However, all of the above are merely examples. Provided that the base angle A1 is less than the base angle A2, according to other embodiments of the present invention, the base angle may be determined based on factors such as materials, sizes, processes, and refractive indexes of the first microstructure unit PL1 and the second microstructure unit PL2, and/or a material, a size, a process, and a refractive index of a light guide medium layer 600 and/or an external medium further disposed on the reflective structure layer 500, an interface of these components, and the like.

For example, when the refractive index of the light guide medium layer 600 covering the first microstructure units PL1 and the second microstructure units PL2 is 1.51 and when the light emitting panel 10 is configured such that the refractive index of the external medium by which the light leaves the light guide medium layer 600 is 1, it is preferable that the base angle A2 of the second microstructure units PL2 ranges from 39 degrees to 42 degrees, for example, ranges from 39.9 degrees to 41.5 degrees, and the like. In this way, at an interface between the light guide medium layer 600 and the external medium, the light that is easy to enter the interface at a critical angle or an angle over the critical angle to generate total reflection can be reflected and guided to other angles by the second microstructure units PL2 and then enter the interface to be emitted. Therefore, the light exit efficiency can be enhanced, the light loss can be reduced or avoided, and the additionally disposed intermediate layer for assisting light scattering and light emission at the interface between the light guide medium layer 600 and the external medium can be reduced or avoided. Carrying on with the above, the appropriate base angle A1 of the first microstructure units PL1 and the appropriate base angle A2 of the second microstructure units PL2 may be selected depending on the situation.

According to some embodiments, when the reflective structure layer 500 is disposed as shown in FIG. 5, the first microstructure units PL1 may be densely designed and distributed because it is not necessary to precisely adjust the process to form the first microstructure units PL1 having a relatively large base angle A1, and the first microstructure units PL1 having a wider distribution range and higher density are used to reflect and guide rays of light in various directions and angles. For example, the rays of light can be diffused, so that the light is emitted more uniformly and can be reflected and guided to the second microstructure units PL2. Further, for the second microstructure units PL2, since the distribution arrangement can be relatively scattered, the process (for example, but not limited to the process of local curing at a low temperature to avoid high temperature melting and collapse) can be controlled more precisely, and the structural detail is adjusted to form the second microstructure units PL2 having a relatively large base angle A2, and the second microstructure units PL2 having the relatively large base angle A2 are used to reflect and emit light in an expected direction and angle. For example, the light that is previously easily totally reflected in the light guide medium layer 600 may be reflected and guided by the second microstructure units PL2 having a specific larger base angle A2 to be emitted from the light emitting panel 10, thereby improving the light exit efficiency.

Therefore, according to this embodiment, the second microstructure units PL2 of the light guide structure having the relatively large base angle A2 may be disposed to guide the reflected light to the expected direction and angle. In addition, by means of the guidance and diffusion of the first microstructure units PL1, the uniformity of the overall emitted light is improved, and the light is increased to be guided to the second microstructure units PL2. In this way, a reduction in the overall light exit efficiency caused by more sparsely distributed light guide structures due to the difficulty of disposing the second microstructure units PL2 is reduced or avoided. Carrying on with the above, according to this embodiment, the specific angle can be effectively increased, and the overall light exit efficiency and the uniformity of light diffusion can be improved.

Figure 6:
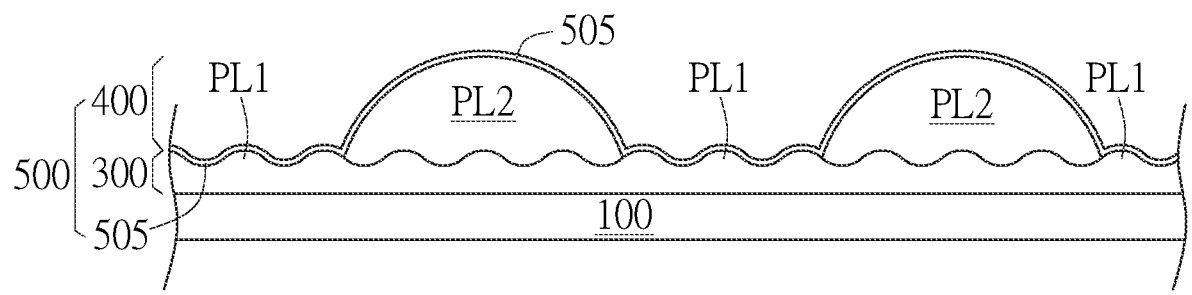
FIG. 6 is an enlarged schematic cross-sectional view of a light emitting panel according to a sixth embodiment of the present invention.

In the above embodiment, the first structure layer 300 and the second structure layer 400 of the reflective structure layer 500 may be made of reflective materials that can reflect light. However, the present invention is not limited thereto. For example, referring to the light emitting panel 20 of FIG. 6, according to still another embodiment of the present invention, the first structure layer 300 and the second structure layer 400 of the reflective structure layer 500 may be made of non-reflective materials (such as UHA), and the reflective structure layer 500 may further include a reflective layer 505 disposed to cover the first structure layer 300 and the second structure layer 400. In detail, the reflective layer 505 may cover the second microstructure units PL2 and a part of the first microstructure units PL1 not covered by the second microstructure units PL2. For example, the reflective layer 505 may be laid on the relative exposed parts of the first structure layer 300 and the second structure layer 400, to define, based on the first microstructure units PL1 and the second microstructure units PL2, a structure having the required reflection angle and direction and perform reflection based on the reflective layer 505 made of the reflective material. Therefore, the first microstructure units PL1 and the second microstructure units PL2 may be made of different materials other than the reflective material more flexibly.

According to some embodiments, the reflective material used for the reflective layer 505, the first microstructure units PL1, and the second microstructure units PL2 may be aluminum or aluminum oxide, but the present invention is not limited thereto.

Figure 7:
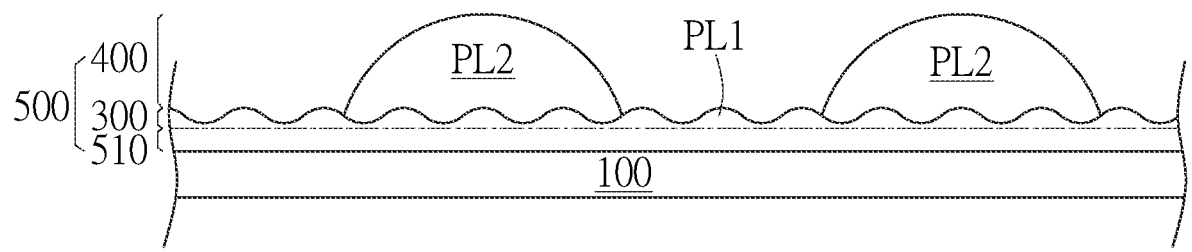
FIG. 7 is an enlarged schematic cross-sectional view of a light emitting panel according to a seventh embodiment of the present invention.

Next, referring to FIG. 7, a light emitting panel 30 according to still another embodiment of the present invention is described.

Carrying on with the above, according to the light emitting panel 30 of an embodiment, the reflective structure layer 500 may further include a bottom layer 510 disposed under the first microstructure units PL1. For example, before the first microstructure units PL1 are formed, the bottom layer 510 having a predetermined thickness may be disposed on the substrate 100, to adjust the structure or cause the first microstructure units PL1 to be more easily formed on the substrate 100. Carrying on with the above, the bottom layer 510 may be disposed based on requirements, and the above factors are only examples. Next, after the bottom layer 510 is disposed, the first structure layer 300 composed of the first microstructure units PL1 and the second structure layer 400 composed of the second microstructure units PL2 are disposed. In addition, in some embodiments, when the first microstructure units PL1 are disposed adjacent to or connected to each other, the bottom thickness of each unit may be relatively indistinguishable, and the bottom layer 510 may be formed or connected to the bottom layer 510 disposed in advance to jointly define the reflective structure layer 500.

In the following, the arrangement of the first microstructure units PL1 and the microstructure units PL2 will be further described in combination with the figure.

Figure 8:
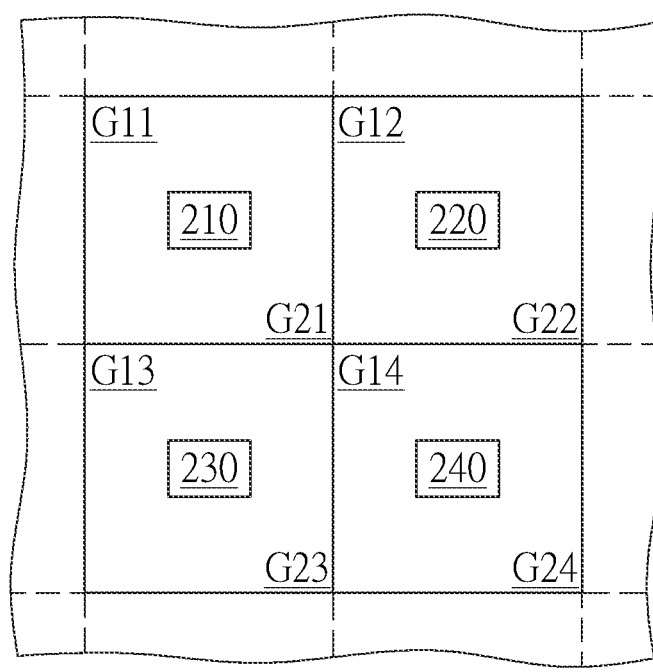
FIG. 8 is a schematic diagram of a configuration of a first microstructure unit set and a second microstructure unit set of a light emitting panel according to an eighth embodiment of the present invention.

Carrying on with the above, referring to FIG. 8, FIG. 8 is a schematic top view of a light emitting panel 40 according to one embodiment of the present invention. The light emitting panel 40 may include at least one light emitting element, and a first light emitting element 210, a second light emitting element 220, a third light emitting element 230, and a fourth light emitting element 240 in a part of the light emitting panel 40 are schematically described herein. Carrying on with the above, a part of the first microstructure units PL1 among the first microstructure units PL1 may form a first microstructure unit set G11, a part of the second microstructure units PL2 among the second microstructure units PL2 may form a second microstructure unit set G21, and the first microstructure unit set G11 and the second microstructure unit set G21 are disposed corresponding around the first light emitting element 210. Similarly, a part of the first microstructure units PL1 among the first microstructure units PL1 may form first microstructure unit sets G12, G13, and G14 disposed respectively around the second light emitting element 220, the third light emitting element 230, and the fourth light emitting element 240. A part of the second microstructure units PL2 among the second microstructure units PL2 may form second microstructure unit sets G22, G23, and G24 disposed respectively around the second light emitting element 220, the third light emitting element 230, and the fourth light emitting element 240.

The first microstructure unit sets G11, G12, G13, and G14 or the second microstructure unit sets G21, G22, G23, and G24 respectively established corresponding to the specific light emitting elements may have a specific arrangement or pattern, and the first microstructure unit set G11 and the second microstructure unit set G21 corresponding to the first light emitting element 210 will be illustrated exemplarily below.

Figure 9:
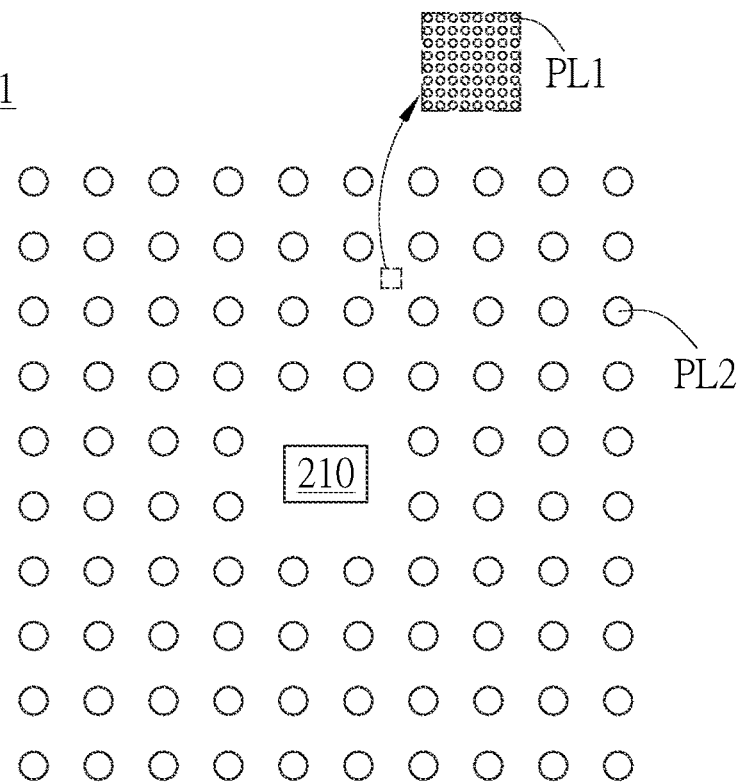
FIG. 9 is a schematic diagram of a configuration of first microstructure units and second microstructure units of a light emitting panel according to a ninth embodiment of the present invention.

Carrying on with the above, referring to FIG. 9, according to one embodiment, among the first microstructure unit set G11 and the second microstructure unit set G21 disposed around the first light emitting element 210, the first microstructure units PL1 and the second microstructure units PL2 may all be distributed in a rectangular array. Since the first microstructure units PL1 are disposed under the second microstructure units PL2 and are densely distributed, for the sake of brevity and clarity of the drawings, the specification and drawings of the present invention only illustrate the distribution and arrangement of a part of the first microstructure units PL1 among the first microstructure units PL1, and those with ordinary knowledge in the art should be able to understand the overall distribution and arrangement therefrom.

Figure 10:
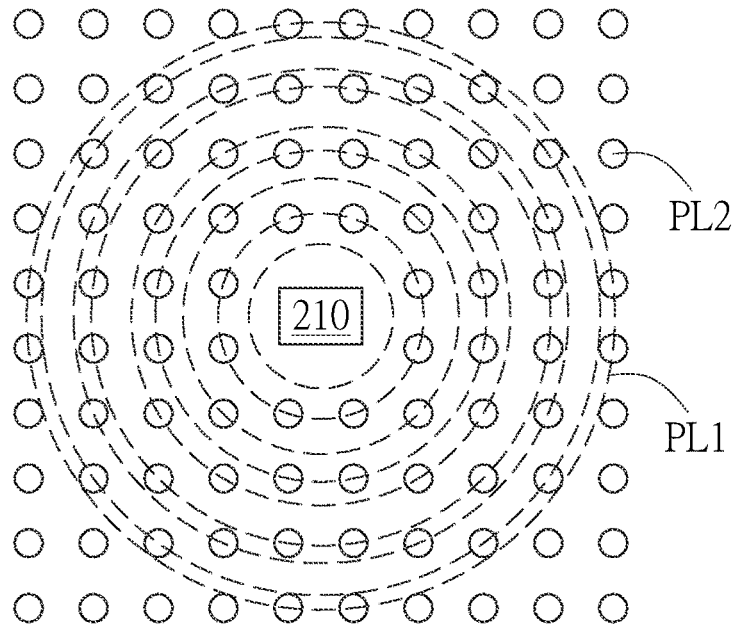
FIG. 10 is a schematic diagram of a configuration of first microstructure units and second microstructure units of a light emitting panel according to a tenth embodiment of the present invention.

Next, referring to FIG. 10, according to still another embodiment, among the first microstructure unit set G11 and the second microstructure unit set G21 disposed around the first light emitting element 210, the second microstructure units PL2 may be arranged in a rectangular array, but the first microstructure units PL1 may be distributed in a ring shape around the at least one light emitting element 210. Specifically, FIG. 10 schematically shows a part of the first microstructure units PL1 among the first microstructure units PL1 distributed in a plurality of circles in a form of concentric circles around the first light emitting element 210 as a center. The second microstructure units PL2 may overlap and cover more than one first microstructure unit PL1. In addition, similar to the above, only part of a few circles of the first microstructure units PL1 are illustrated herein, and a quantity and intensity of substantially disposed circles are not limited thereto (for example, a larger number of denser circles can be disposed substantially).

Figure 11:
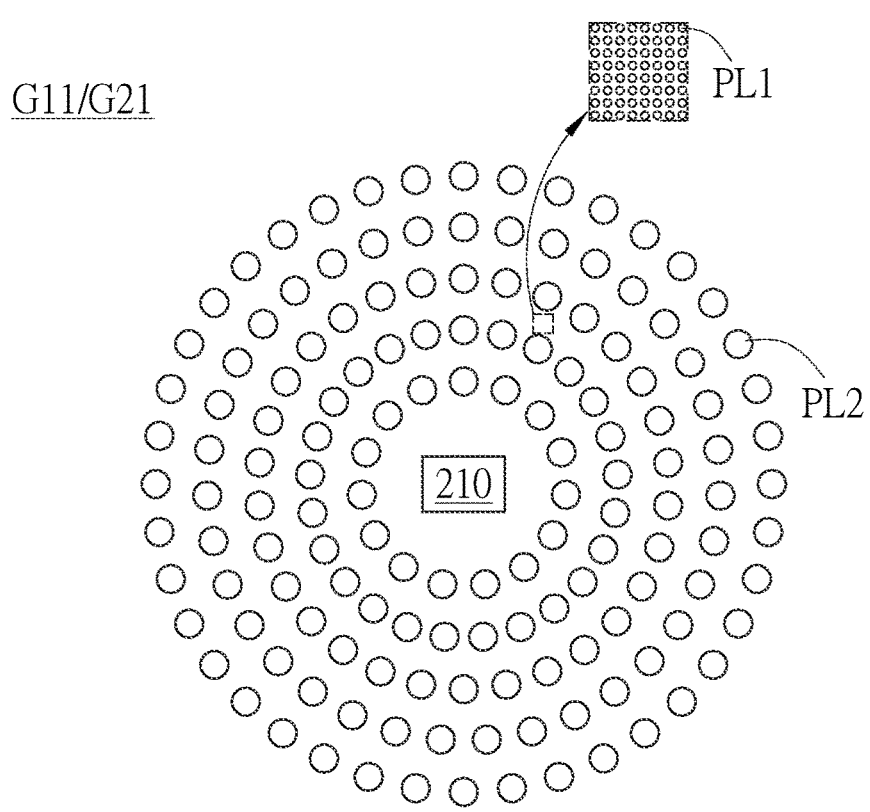
FIG. 11 is a schematic diagram of a configuration of first microstructure units and second microstructure units of a light emitting panel according to an eleventh embodiment of the present invention.

In addition, according to yet another embodiment, as shown in FIG. 11, contrary to the above embodiments, the first microstructure units PL1 may be distributed in a rectangular array, and the second microstructure units PL2 of the second microstructure unit set G21 may be distributed in a ring shape around the at least one light emitting element 210 as the center. For example, a part of the second microstructure units PL2 among the second microstructure units PL2 may be distributed in a plurality of circles in a form of concentric circles around the first light emitting element 210 as the center.

Figure 12:
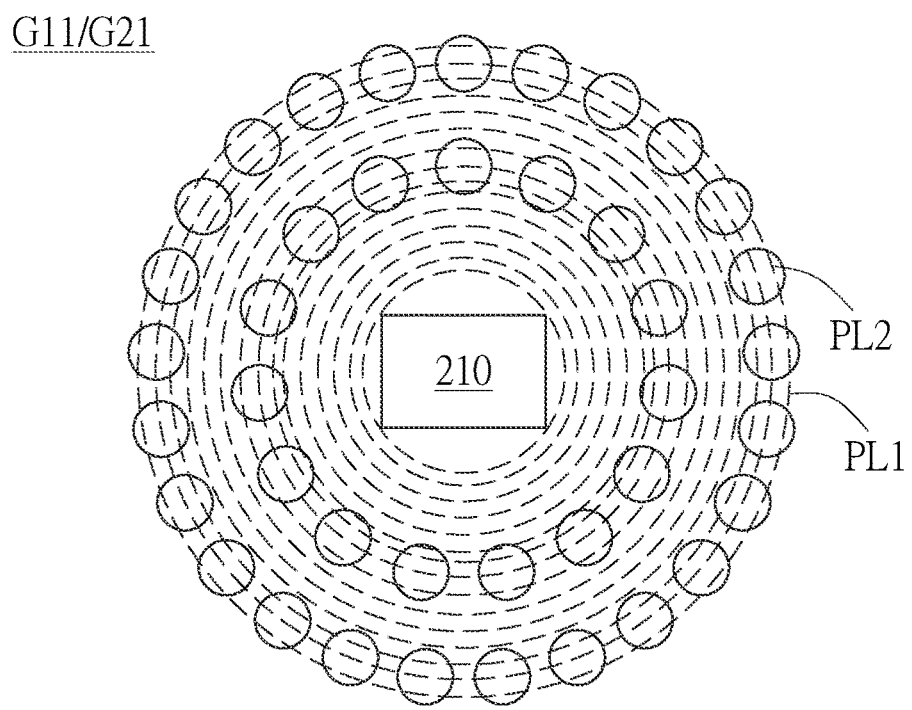
FIG. 12 is a schematic diagram of a configuration of first microstructure units and second microstructure units of a light emitting panel according to a twelfth embodiment of the present invention.

Further, referring to FIG. 12, the first microstructure units PL1 and the second microstructure units PL2 may both be distributed in a ring shape around the at least one light emitting element 210 as the center. For example, a part of the first microstructure units PL1 among the first microstructure units PL1 and a part of the second microstructure units PL2 among the second microstructure units PL2 may be distributed in a plurality of circles in a form of concentric circles around the first light emitting element 210 as the center. Carrying on with the above, in addition to the difference in the proportion of its own size to the spacing between adjacent microstructure units, the first microstructure units PL1 and the second microstructure units PL2 may respectively form the first microstructure unit set G11 and the second microstructure unit set G21 in a similar distribution mode.

In addition, referring to FIG. 13A and FIG. 13B, the distribution in the form of a ring shape or in the form of concentric circles according to the above embodiments may be performed in different forms. For example, as shown in FIG. 13A, the first microstructure units PL1 or the second microstructure units PL2 are arranged one by one to form a ring or a concentric circle. Alternatively, as shown in FIG. 13B, each of the first microstructure units PL1 or the second microstructure units PL2 is arranged in a form of a continuous ring to form a ring or a concentric circle. Carrying on with the above, in the implementations shown in FIG. 13A and FIG. 13B, a minimum cross-sectional area relative to the first microstructure units PL1 or the second microstructure units PL2 may be intercepted along a section line C-C'. As described above, the intercepted schematic cross-sectional view may be the same or similar to that shown in FIG. 13C, and may correspondingly define the cross-sectional bottom length L1 of the first microstructure units PL1, the cross-sectional bottom length L2 of the second microstructure units PL2, the spacing S1 between the first microstructure units PL1, and the spacing S2 between the second microstructure units PL2 as described above, and the details will not be described herein again.

Some arrangements of the first microstructure units PL1 and the second microstructure units PL2 have been specifically exemplified above. Furthermore, in addition to the above arrangement implementation, in fact, the size or the shape of the first microstructure units PL1 and the second microstructure units PL2 or the spacing between adjacent microstructure units may also be changed according to requirements.

Figure 14:
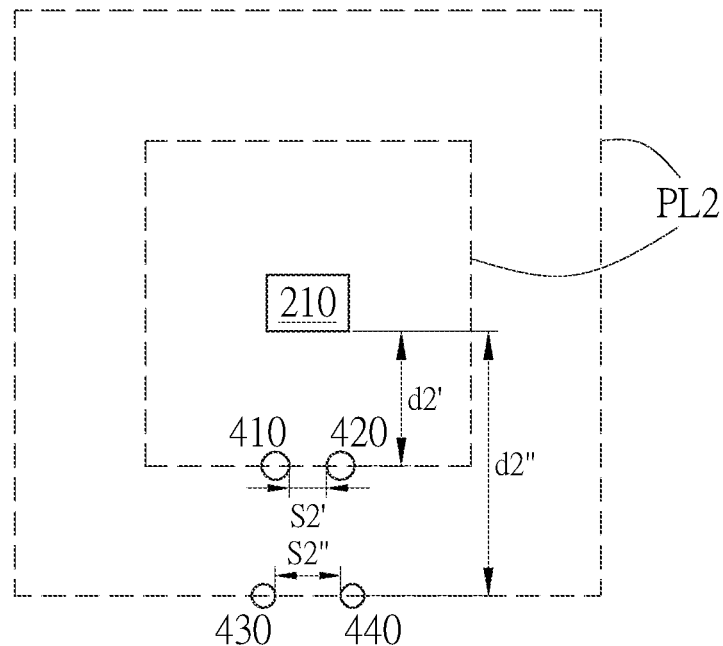
FIG. 14 is a schematic diagram of sizes and spacings of second microstructure units configured relative to an inner ring and an outer ring according to a sixteenth embodiment of the present invention.

For example, referring to FIG. 14, according to one embodiment, the second microstructure units PL2 in the second microstructure unit set G21 may be distributed around the first light emitting element 210 of the at least one light emitting element in a rectangular array or a ring form. The sizes of the second microstructure units 410 and 420 distributed relatively on an inner ring, for example but not limited to being at a distance of d2' (for example, at 2000 μm) from the first light emitting element 210, may be greater than the sizes of the second microstructure units 430 and 440 distributed relatively on an outer ring, for example but not limited to being at a distance of d2" (for example, at 4000 μm) from the first light emitting element 210. For example, the sizes of the second microstructure units PL2 in the second microstructure unit set G21 may decrease as the distance from the first light emitting element 210 that is surrounded increases, or the sizes of at least part of the second microstructure units PL2 at a relative large distance from the first light emitting element 210 that is surrounded are less than the sizes of a part of the second microstructure units PL2 at a relative small distance from the first light emitting element 210 that is surrounded.

Still referring to FIG. 14, according to some embodiments, the spacing between the first microstructure units PL1 and/or the spacing between the second microstructure units PL2 may also be substantially adjusted depending on the distance. For example, a spacing ST between the second microstructure units 410 and 420 distributed relatively on an inner ring, for example but not limited to being at a distance of d2' (for example, at 2000 μm) from the first light emitting element 210, may be less than a spacing ST between the second microstructure units 430 and 440 distributed relatively on an outer ring, for example but not limited to being at a distance of d2" (for example, at 4000 μm) from the first light emitting element 210. For example, the spacing between two adjacent ones of the second microstructure units PL2 in the second microstructure unit set G21 may increase as the distance from the first light emitting element 210 that is surrounded increases. Alternatively, a spacing between adjacent ones of at least part of the second microstructure units PL2 at a relative large distance from the first light emitting element 210 that is surrounded is greater than a spacing between adjacent ones of a part of the second microstructure units PL2 at a relative small distance from the first light emitting element 210 that is surrounded.

Carrying on with the above, the size and/or the spacing of the second microstructure units PL2 are/is adjusted based on the distance from the light emitting element, so that the second microstructure units PL2 are arranged more densely or occupy a larger range in a light path where the light within a critical angle range that total reflection is easily generated is transmitted, thereby enhancing the light exit efficiency under the control of materials.

Figure 15:
FIG. 15 is a schematic diagram of base angles of second microstructure units configured relative to an inner ring and an outer ring according to a seventeenth embodiment of the present invention.
Figure 15:
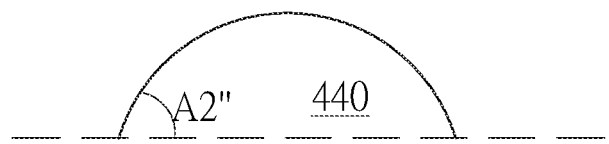

Further, referring to FIG. 15 together with FIG. 14, the base angles of the second microstructure units PL2 at different distances from the first light emitting element 210 may also be different. For example, the base angle A2' of the second microstructure unit 420 at a smaller distance may be different from the base angle A2" of the second microstructure unit 440 at a larger distance. For example, the base angle A2" of the second microstructure unit 440 at a larger distance from the first light emitting element 210 may be greater than the base angle A2' of the second microstructure unit 420 at a smaller distance from the first light emitting element 210. According to some embodiments, the base angle A2' of the second microstructure unit 420 may range from 30 degrees to 35 degrees, and the base angle A2" of the second microstructure unit 440 may range from 35 degrees to 40 degrees. However, the above is merely an example, and the present invention is not limited thereto.

Carrying on with the above, the target light that may be totally reflected (the light that requires to be reflected and guided by the second microstructure unit PL2), after being totally reflected at the light exit interface, will have different incident angles or reflection angles between the light incident on the second microstructure unit PL2 relatively close to the inner ring and the light incident on the second microstructure unit PL2 relatively close to the outer ring. Therefore, the base angles of the second microstructure units PL2 on the inner ring and the outer ring may be disposed according to the corresponding incident angles or reflection angles of the target light. In this way, the correspondingly received target light can have a better reflection and guide effect. For example, the light having a smaller incident angle that is totally reflected at the light exit interface is reflected back to the second microstructure unit PL2 closer to the inner ring, and thus the second microstructure unit PL2 closer to the inner ring may be disposed to have a smaller base angle.

In addition, the implementations described for the second microstructure units PL2 according to FIG. 14 and FIG. 15 may also be similarly applicable to the first microstructure units PL1, and the details will not be described herein again.

Figure 16:
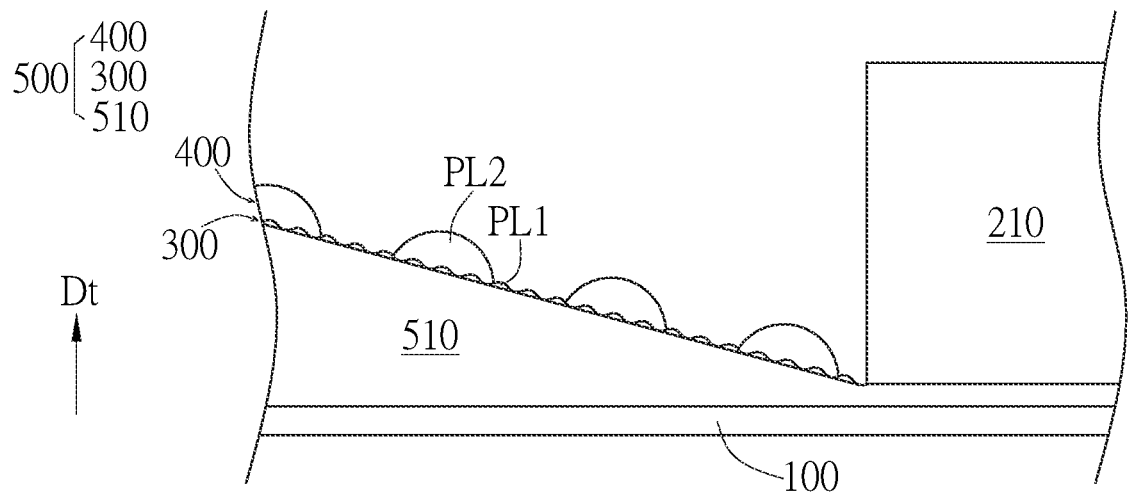
FIG. 16 is a schematic diagram of a configuration of a reflective structure layer according to an eighteenth embodiment of the present invention.

Next, referring to FIG. 16, according to yet another embodiment of the present invention, a height of the bottom layer 510 under the first microstructure units PL1 may vary. Specifically, the reflective structure layer 500 may further include the bottom layer 510. The height of the bottom layer 510 under the first microstructure units PL1 in the first microstructure unit set G11 and the second microstructure units PL2 in the second microstructure unit set G21 that are distributed corresponding to the first light emitting elements 210 along the height direction Dt may increase as the distance from the first light emitting element 210 that is surrounded increases. For example, the first microstructure unit set G11, the second microstructure unit set G21, and the reflective structure layer 500 constructed thereunder distributed corresponding to the first light emitting element 210 may be formed into a concave bowl-shaped configuration around the first light emitting element 210. In this way, the light emitted at a specific angle and unable to be reflected and guided by the first microstructure units PL1 and/or the second microstructure units PL2 close to the first light emitting element 210 is prone to be reflected and guided by the first microstructure units PL1 and/or the second microstructure units PL2 that are higher and further away from the first light emitting element 210. Carrying on with the above, the proportion of the reflected and guided light and the light exit efficiency of the light emitted by the first light emitting element 210 may be improved based on the configuration.

Figure 17:
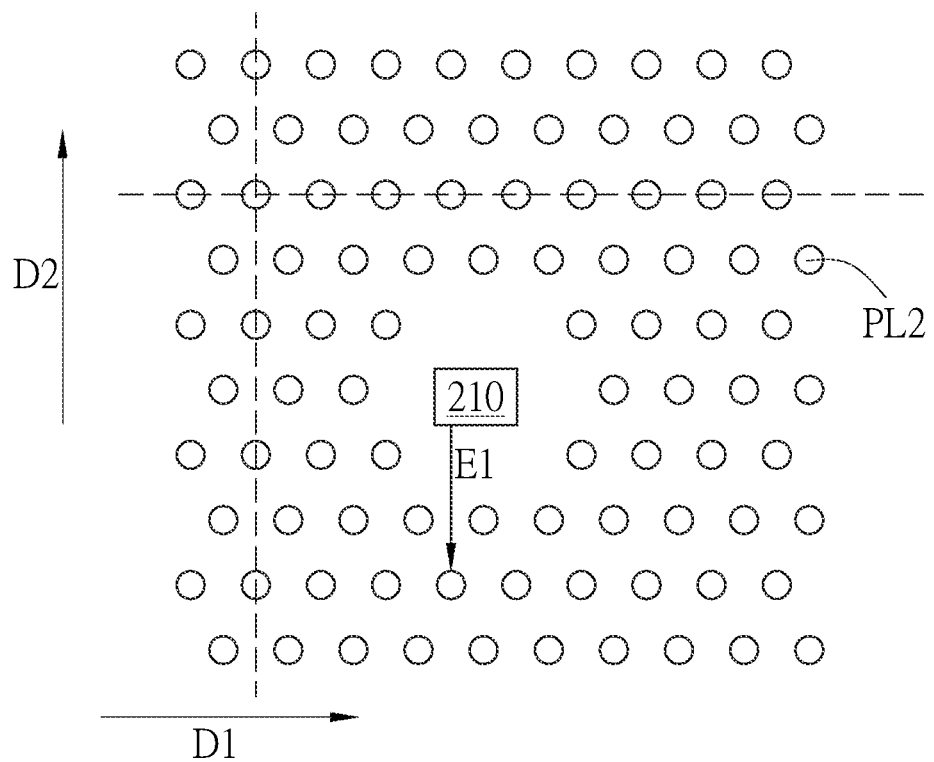
FIG. 17 is a schematic diagram of a configuration of second microstructure units in a same microstructure unit set according to a nineteenth embodiment of the present invention.

Further, although the above embodiments disclose some implementations of aligning the first microstructure units PL1 to the second microstructure units PL2, according to other embodiments of the present invention, the first microstructure units PL1 and/or the second microstructure units PL2 may be substantially staggered. For example, FIG. 17 shows the second microstructure unit set G21 distributed around the first light emitting element 210. The second microstructure units PL2 in the second microstructure unit set G21 may be distributed around the first light emitting element 210 to form a plurality of rows. Carrying on with the above, the second microstructure units PL2 are arranged in each of the plurality of rows along a first direction D1, and the second microstructure units PL2 in two adjacent rows are not aligned in a second direction D2 perpendicular to the first direction D1. Therefore, if a ray of light E1 is emitted along the second direction D2 or an opposite direction, and is not reflected and guided by the second microstructure units PL2 in a specific row, the ray of light E1 may be reflected and guided in the second direction D2 or the opposite direction by the second microstructure units PL2 in other rows disposed alternately with the specific row. Thus, the probability that light is not reflected and guided can be reduced or avoided.

Similarly, although not shown herein, the first microstructure units PL1 in the first microstructure unit set G11 may also be distributed in a similar manner, to enhance the light exit efficiency and reduce or avoid generation of escaped rays of light. That is to say, the first microstructure units PL1 in the first microstructure unit set G11 may be distributed around the first light emitting element 210 of the at least one light emitting element 200 to form a plurality of rows. The first microstructure units PL1 are arranged in each of the plurality of rows along the first direction D1, and the first microstructure units PL1 in two adjacent rows are not aligned in a second direction D2 perpendicular to the first direction D1. In addition, the above implementation of the staggered configuration specifically shown in FIG. 17 is merely an example. According to other embodiments of the present invention, the first microstructure units PL1 in the first microstructure unit set G11 and/or the second microstructure units PL2 in the second microstructure unit set G21 may be arranged in various alternate or staggered arrangements. In this way, the ray of light E1 emitted by the first light emitting element 210 may be reflected and guided by at least one first microstructure unit PL1 and/or at least one second microstructure unit PL2.

Figure 18:
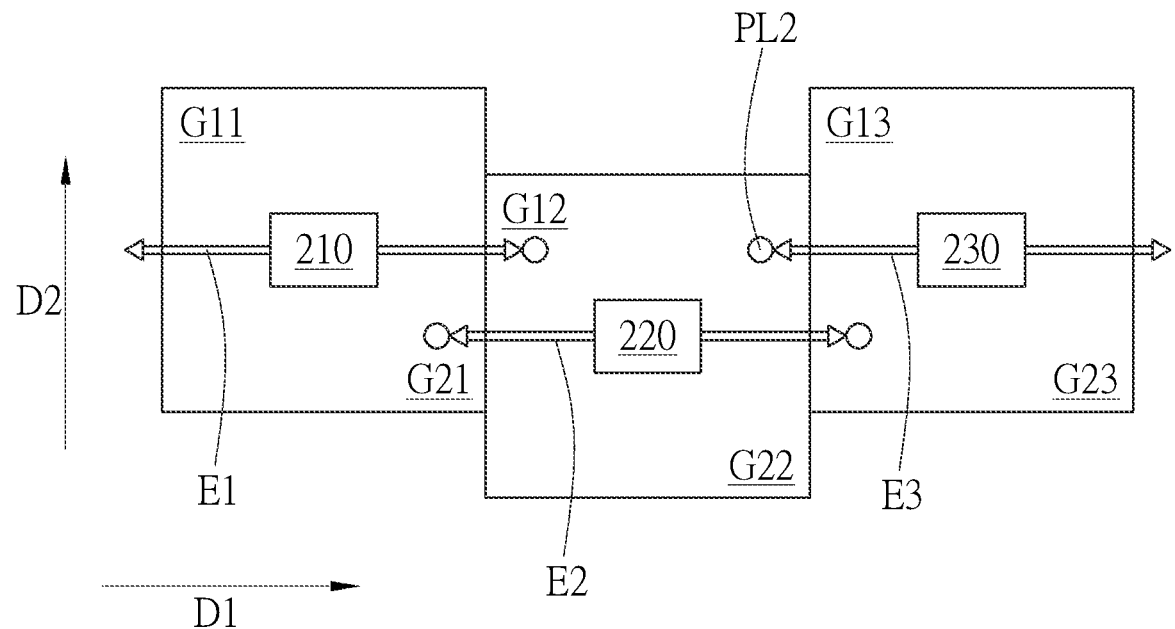
FIG. 18 is a schematic diagram of a configuration of different light emitting elements and corresponding microstructure unit sets thereof according to a twentieth embodiment of the present invention.

In addition, further referring to FIG. 18, according to the light emitting panel 50 of other embodiments of the present invention, except for the changes in the configurations of the first microstructure unit set G11 and the second microstructure unit set G21 themselves, at least two light emitting elements of the light emitting elements may also be staggered to improve the light exit efficiency. For example, the at least one light emitting element may include a first light emitting element 210, a second light emitting element 220, a third light emitting element 230, and the like. The first light emitting element 210, the second light emitting element 220, and the third light emitting element 230 are non-collinearly staggered along the first direction D1. That is to say, the first light emitting element 210, the second light emitting element 220, and the third light emitting element 230 may be substantially arranged along the first direction D1, but at least partially staggered in the second direction D2. Therefore, if the ray of light E1 is emitted from the first light emitting element 210 and is not reflected and guided by the corresponding first microstructure unit set G11 and the corresponding second microstructure unit set G21, the ray of light E1 may be reflected and guided by the first microstructure unit set and the second microstructure unit set corresponding to other light emitting elements. For example, the ray of light E1 may be reflected and guided by the first microstructure unit set G12 and/or the second microstructure unit set G22. Similarly, as shown in FIG. 18, a ray of light E2 from the second light emitting element 220 and a ray of light E3 from the third light emitting element 230 respectively may also be reflected and guided by the other first microstructure unit sets and second microstructure unit sets, even if not reflected and guided by the corresponding first microstructure unit set and the corresponding second microstructure unit set. Therefore, the generation of escaped rays of light of emitted light that is not reflected and guided can be reduced or avoided.

All of the implementations described above may be used in combination with each other without conflict with each other, and those with ordinary knowledge in the art should be able to understand the variations of the applications from the above description.

Based on the above, according to the light emitting panel provided in the embodiments of the present invention, the uniformity of light diffusion can be improved, the overall light exit efficiency can be enhanced, and the defect that light emitted from the specific angle is difficult to emit out can be reduced or avoided. Therefore, the light emitting effect and light emitting efficiency of the light emitting panel can be improved.

The above are merely some exemplary embodiments of the present invention. It should be noted that various variations and amendments may be made to the present invention without departing from the spirit and the principle of the present invention. A person of ordinary skill in the art should understand that the present invention is defined by the claims attached, and in a case of complying with the intention of the present invention, various possible changes such as substitutions, combinations, modifications and diversions fall within the scope of the present invention as defined in the claims attached.

REFERENCE NUMERALS 10, 20, 30, 40, 50: light emitting panel
100: substrate
200: light emitting element
210: first light emitting element
220: second light emitting element
230: third light emitting element
240: fourth light emitting element
300: first structure layer
310, 320: first microstructure unit
400: second structure layer
410, 420, 430, 440: second microstructure units
500: reflective structure layer
505: reflective layer
510: bottom layer
600: light guide medium layer
G11, G12, G13, G14: first microstructure unit set
G21, G22, G23, G24: second microstructure unit set
PL1: first microstructure unit
PL2: second microstructure unit
L1, L2: bottom length
S1, S2, S2', S2": spacing
M1, M2: cross-sectional area
A1, A2, A2', A2": base angle
Dt: height direction
D1: first direction
D2: second direction
E: light
E1, E2, E3: light
B: area
d2', d2": distance
t1, t2: height

What is claimed is:

1. A light emitting panel, comprising:
    a substrate;
    at least one light emitting element, disposed on the substrate; and
    a reflective structure layer, comprising:
        a plurality of first microstructure units, disposed on the substrate and distributed around the at least one light emitting element, and
        a plurality of second microstructure units, disposed on and overlapping the first microstructure units, wherein
    a spacing between adjacent first microstructure units among the first microstructure units is less than a spacing between adjacent second microstructure units among the second microstructure units.

2. The light emitting panel according to claim 1, wherein a distribution density of the first microstructure units is higher than a distribution density of the second microstructure units.

3. The light emitting panel according to claim 1, wherein each of the second microstructure units at least partially overlaps and covers more than one first microstructure units among the first microstructure units.

4. The light emitting panel according to claim 1, wherein a part of the first microstructure units among the first microstructure units are disposed without overlapping the second microstructure units.

5. The light emitting panel according to claim 1, wherein a minimum cross-sectional area of each of the first microstructure units in a height direction is less than a minimum cross-sectional area of each of the second microstructure units in the height direction.

6. The light emitting panel according to claim 1, wherein a base angle of each of the first microstructure units is less than a base angle of each of the second microstructure units.

7. The light emitting panel according to claim 1, wherein the reflective structure layer further comprises a reflective layer disposed to cover the second microstructure units and a part of the first microstructure units not covered by the second microstructure units.

8. The light emitting panel according to claim 1, wherein the first microstructure units are distributed in a ring shape around the at least one light emitting element.

9. The light emitting panel according to claim 8, wherein a part of the first microstructure units is distributed in a form of concentric circles around one of the at least one light emitting element.

10. The light emitting panel according to claim 1, wherein the second microstructure units are distributed in a ring shape around the at least one light emitting element.

11. The light emitting panel according to claim 10, wherein a part of the second microstructure units is distributed in a form of concentric circles around one of the at least one light emitting element.

12. The light emitting panel according to claim 1, wherein the first microstructure units, the second microstructure units, or combinations thereof are distributed in a rectangular array.

13. The light emitting panel according to claim 1, wherein a part of the second microstructure units among the second microstructure units forms a second microstructure unit set, the second microstructure units in the second microstructure unit set are distributed around a first light emitting element of the at least one light emitting element, and a spacing between two adjacent ones of the second microstructure units in the second microstructure unit set increases as a distance from the first light emitting element that is surrounded increases.

14. The light emitting panel according to claim 1, wherein a part of the second microstructure units among the second microstructure units forms a second microstructure unit set, the second microstructure units in the second microstructure unit set are distributed around a first light emitting element of the at least one light emitting element, and sizes of the second microstructure units in the second microstructure unit set decrease as a distance from the first light emitting element that is surrounded increases.

15. The light emitting panel according to claim 1, wherein the reflective structure layer further comprises a bottom layer disposed under the first microstructure units, wherein a part of the first microstructure units among the first microstructure units forms a first microstructure unit set, the first microstructure units in the first microstructure unit set are distributed around a first light emitting element of the at least one light emitting element, and a height of the bottom layer under the first microstructure units in the first microstructure unit set increases as a distance from the first light emitting element that is surrounded increases.

16. The light emitting panel according to claim 1, wherein the at least one light emitting element comprises a first light emitting element, a second light emitting element, and a third light emitting element, wherein the first light emitting element, the second light emitting element, and the third light emitting element are non-collinearly staggered along a first direction.

17. The light emitting panel according to claim 1, wherein a part of the first microstructure units among the first microstructure units forms a first microstructure unit set, and the first microstructure units in the first microstructure unit set are distributed around a first light emitting element of the at least one light emitting element to form a plurality of rows, wherein
the first microstructure units are arranged in each of the plurality of rows along a first direction, and the first microstructure units in two adjacent rows are not aligned in a second direction perpendicular to the first direction.

18. The light emitting panel according to claim 1, wherein a part of the second microstructure units among the second microstructure units forms a second microstructure unit set, and the second microstructure units in the second microstructure unit set are distributed around a first light emitting element of the at least one light emitting element to form a plurality of rows, wherein
the second microstructure units are arranged in each of the plurality of rows along a first direction, and the second microstructure units in two adjacent rows are not aligned in a second direction perpendicular to the first direction.

19. The light emitting panel according to claim 1, wherein a base angle of each of the second microstructure units is between 20 degrees and 50 degrees.

20. The light emitting panel according to claim 1, wherein among the second microstructure units distributed around a first light emitting element of the at least one light emitting element, a base angle of the second microstructure unit at a larger distance from the first light emitting element is greater than a base angle of the second microstructure unit at a smaller distance from the first light emitting element.

21. The light emitting panel according to claim 1, wherein heights of the first microstructure units range from 1 μm to 5 μm.

* * * * *